United States Patent
Cramer

(10) Patent No.: US 7,816,631 B2
(45) Date of Patent: Oct. 19, 2010

(54) INVERTER WITH A HOUSING HAVING A COOLING UNIT

(75) Inventor: Günther Cramer, Kassel (DE)

(73) Assignee: SMA Solar Technology AG, Niestetal (DE)

(*) Notice: Subject to any disclaimer, the term of this patent is extended or adjusted under 35 U.S.C. 154(b) by 448 days.

(21) Appl. No.: 11/158,961

(22) Filed: Jun. 22, 2005

(65) Prior Publication Data

US 2006/0171115 A1  Aug. 3, 2006

(30) Foreign Application Priority Data

Jun. 24, 2004 (DE) .................... 10 2004 030 457
Jun. 24, 2004 (DE) .................... 20 2004 009 926 U

(51) Int. Cl.
H05B 6/42 (2006.01)
H05K 7/20 (2006.01)

(52) U.S. Cl. .................. 219/632; 219/757; 361/688
(58) Field of Classification Search .................. 219/632, 219/757, 677; 361/688–697; 363/14, 178
See application file for complete search history.

(56) References Cited

U.S. PATENT DOCUMENTS 6,661,659 B2 * 12/2003 Tamba et al. ............... 361/699

7,012,446 B2 * 3/2006 Taguchi et al. ............. 324/772
2001/0014029 A1 * 8/2001 Suzuki et al. ............... 363/141
2005/0151517 A1 * 7/2005 Cook et al. .................. 323/207
2005/0253465 A1 * 11/2005 Takenaka et al. ............ 310/52

FOREIGN PATENT DOCUMENTS

| DE | 42 32 763 A1 | 3/1994 |
| EP | 1 283 589 A2 * | 2/2003 |
| JP | 10150284 A | 6/1998 |
| JP | 2003-198169 * | 7/2003 |

* cited by examiner

Primary Examiner—Quang T Van
(74) Attorney, Agent, or Firm—Eschweiler & Associates, LLC

(57) ABSTRACT

The inverter housing (1) has a cooling unit (2) for cooling the electronic and/or electric components (4, 5, 5a) of the inverter. The housing (1) of the inverter comprises at least two chambers, the two chambers (7, 8) being separated by a wall (6) for receiving the electronic and/or electric components (4, 5, 5a), the components (5) comprise cooling bodies (4) located on the one side of the wall in the one chamber (7) with the cooling bodies (4) being located on the other side of the wall (6) in the other chamber (5) and the electric or electronic component to be cooled have a high protection grade, the component (5a) being located in the other chamber (8), preferably on the wall side of the wall (6) of the other chamber (8), the other chamber (8) comprising the cooling unit (2).

18 Claims, 1 Drawing Sheet

US 7,816,631 B2

INVERTER WITH A HOUSING HAVING A COOLING UNIT

CROSS-REFERENCE TO RELATED APPLICATIONS

This application claims Priority from German Application No. DE 10 2004 030 457.2-32 filed on Jun. 24, 2004 and DE 20 2004 009 926.8 filed on Jun. 24, 2004

1. FIELD OF THE INVENTION

The present invention relates to an inverter with a housing having a cooling unit for cooling the electronic and/or electric components of the inverter.

2. DESCRIPTION OF THE PRiOR ART

Inverters are well known. They include a housing for accommodating the electric and/or electronic components. Such an inverter housing often has ventilation means, more specifically in the form of an electric fan, with the electric or electronic components being cooled by the outside air drawn into the housing. Since inverters are not only installed in buildings but also outside buildings, the fan not only draws air but also dirt, dust and moisture into the housing. Accordingly, the electric and/or electronic components within the housing of the inverter will soon get very dirty. This contamination causes the known failures. The utilization of filters disposed upstream of the fan is also a problem because the cooling performance is very moderate if the filter is clogged.

BRIEF SUMMARY OF THE INVENTION

It is therefore the object of the invention to provide an inverter of the type mentioned herein above in which the cooling performance is provided substantially without restriction over a long period of time, even under adverse outside conditions.

This object is solved, in accordance with the invention, in that the housing of the inverter comprises at least two chambers, with the two chambers being separated by a wall for receiving the lossy components, with the components, if they comprise cooling bodies, being located on the one side of the wall in the one chamber and the cooling bodies, on the other side of the wall in the other chamber and with the component to be cooled, a transformer for example, if it has a high protection grade, being located on the wall side in the other chamber, with the other chamber comprising the cooling unit and being cooled as a result thereof. Meaning, only that chamber of the inverter housing is cooled that accommodates the cooling bodies or components to be cooled having a high protection grade. It is well known that the cooling bodies or the heat exchangers are very insensitive against dirt and moisture, at least however much more insensitive than the electric and/or electronic components of the inverter that are not particularly protected. Inasmuch, the cooling bodies and the components having a high protection grade may lie directly in the cooling stream, with the contamination of the cooling bodies and the contamination on the components having a high protection grade (e.g. IP65) having but little influence on the cooling performance. However, a corresponding filter may be mounted downstream or upstream the cooling unit such as a fan.

Further advantageous features are recited in the subordinate claims. There is for example provided that the other chamber comprises vent slots, said vent slots being advantageously disposed at the end opposite the cooling unit in the other chamber so that the cooling air is allowed to flow from one end to the other through the chamber.

Further, the one chamber advantageously comprises a higher protection grade than the other chamber, that is to say that the one chamber, which comprises the electronic and/or electric components, is in particular also sealed dust tight and protected against splash water, whereas the other chamber is easy to aerate and needs therefore be protected against dust and moisture to a moderate extent only.

The invention is explained in further detail herein after with reference to the drawing.

DETAILED DESCRIPTION OF THE INVENTION

Figure 1:
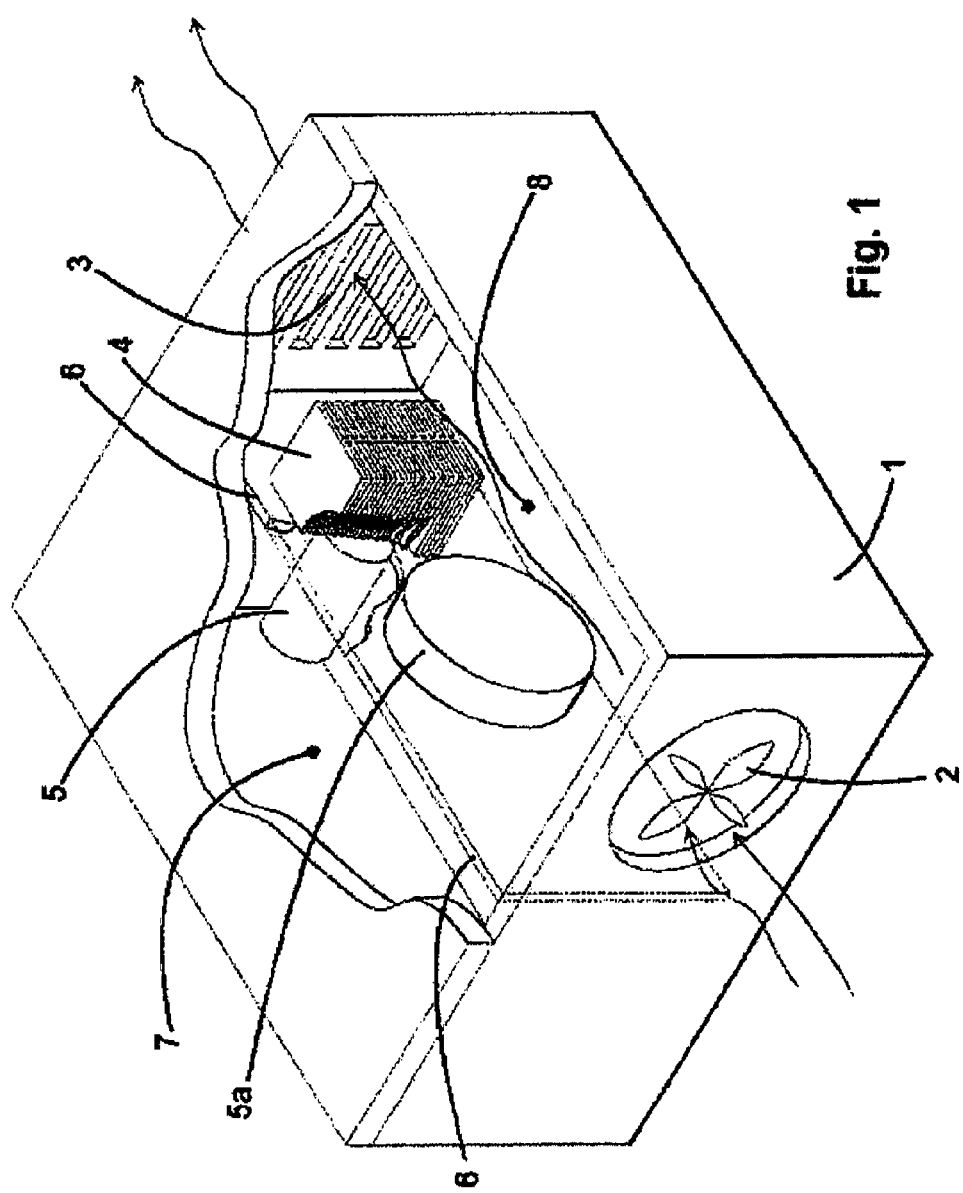
FIG. 1 is a perspective view, with portions broken away, of the housing constructed according to the teachings of the invention.

The inverter has the housing 1 with the partition wall 6 dividing the housing into two chambers 7 and 8 being disposed centrally within the housing. The partition wall 6 itself receives the lossy electronic and electric components 5. The components 5 themselves project into the chamber 7; by contrast, the cooling bodies 4 in the form of heat exchangers, which are disposed on the components 5, are located at the opposite side of this partition wall 6 and hence project into the other chamber 8. This means that the electric and/or electronic components are connected to their cooling bodies through the partition wall 6. That is, there is provided a thermal connection between the cooling body 4 and the component 5 to allow the heat to be carried from the component to the cooling body.

Other lossy components 5a, such as a transformer with a high protection grade, may be disposed directly in the other cooled chamber 8 as the high protection grade makes them insensitive to contamination.

This other chamber 8 comprises a fan 10 and corresponding vent slots 3 that are disposed in the chamber 8 of the housing at the end opposite the fan in the housing. The important point thereby is that the one chamber has a higher protection grade than the other chamber in order to make certain that the electric or electronic components are protected against dirt and moisture. This applies to all the components except for those themselves having a high protection grade, e.g., cast windings such as transformers or chokes that are disposed directly in the other chamber 8. Other electric and electronic components that only have, if at all, low power dissipation are housed in the one chamber 7, which is not cooled, at any location in said chamber 7, meaning not necessarily on the wall 6.

I claim:

1. An inverter with a housing having a cooling unit for cooling electronic components and electrical components of the inverter mounted in said housing, said housing of the inverter comprising first and second chambers, said first and second chambers being separated by a wall and configured to receive in the two chambers the electronic components and the electrical components said electronic components and electrical component being cooled by the cooling unit, said electronic components being sensitive to dirt and humidity and being located on one side of the wall in said first chamber which is closed and which has a higher IP grade rating for protection to humidity and dust than the electrical components mounted in said second chamber, heat sink cooling fins which are located on the other side of the wall in the said second chamber which is open to ambient atmosphere, said heat sink including heat exchange structure extending through said wall and being thermally conductively coupled to said electronic components in said first chamber and to said cooling fins in said second chamber and at least one of a choke and a transformer also being located in said second chamber, said electrical components in said second chamber being less sensitive to humidity and dirt than said electronic components in said first chamber, and said second chamber having a cooling system including said cooling unit positioned at one end of said second chamber for cooling both said cooling fins and said electrical components.

2. The inverter as set forth in claim 1, wherein said second chamber has vent slots at an end opposite said cooling system.

3. The inverter as set forth in claim 1, wherein the cooling unit is configured to be a fan.

4. The inverter of claim 3, wherein the fan is configured to move air across both the electrical components and the heat sink cooling fins in the second chamber.

5. The inverter as set forth in claim 1 wherein said IP grade rating is IP 65.

6. The inverter as set forth in claim 1, wherein said at least one of the choke and the transformer is located on a side of the wall in said second chamber.

7. The inverter as set forth in claim 1 wherein said electronic components comprise electronic components normally found in an inverter.

8. The inverter of claim 1, wherein the first chamber excludes an air flow movement device.

9. An inverter comprising:
  a housing comprising a first chamber and a second chamber, the chambers being separated from each other by a wall;
  a cooling unit for forcing an air flow through the second chamber;
  a first heat generating electric or electronic component arranged in the first chamber;
  a second heat generating electric or electronic component of a high protection grade being arranged in the second chamber;
  a heat sink being in thermal contact with the first heat generating electric or electronic component and extending from the first chamber through the wall into the second chamber, wherein the first chamber is dust and moisture tight against the ambient air, and wherein the second heat generating electric or electronic component and the portion of the heat sink extending into the second chamber is configured to be cooled by the air flow.

10. The inverter of claim 9 comprising
  the second chamber being open to the ambient and having a lower Ip grade rating than the first chamber.

11. The inverter of claim 9, wherein the cooling unit comprises a fan.

12. The inverter of claim 11, wherein the fan is configured to move air across both the electric or electronic second component and the heat sink in the second chamber.

13. The inverter of claim 9, wherein the heat generating second component comprises at least one of a transformer, a cast winding and a choke.

14. The inverter of claim 9, further comprising vent slots arranged on a side of the second chamber being substantially opposite of the cooling unit.

15. The inverter of claim 9, wherein the heat sink is configured to receive heat energy exclusively from the first heat generating electric of electronic component, and is configured to release heat energy substantially exclusively to the air flow.

16. The inverter of claim 9, wherein the first chamber excludes an air flow movement device.

17. An inverter comprising:
  a housing comprising a first chamber and a second chamber the chambers being separated from each other by a wall;
  a cooling unit for forcing an air flow through the second chamber;
  a first heat generating electric or electronic component arranged in the first chamber;
  a second heat generating electric or electronic second component of a high protection grade being arranged in the second chamber;
  a heat sink being in thermal contact with the first heat generating electric or electronic component and extending from the first chamber through the wall into the second chamber, wherein the first chamber is dust and moisture tight against the ambient air, and wherein the second heat generating electric or electronic component and the portion of the heat sink extending into the second chamber is configured to be cooled by the air flow,
  the second chamber being open to the ambient and having a lower protection grade than the first chamber,
  the cooling unit comprising a fan,
  the heat generating second component comprising at least one of a transformer, a cast winding and a choke.

18. The inverter of claim 17, wherein the first chamber excludes an air flow movement device.

\* \* \* \* \*